United States Patent
Wang

(10) Patent No.: US 8,405,988 B2
(45) Date of Patent: Mar. 26, 2013

(54) ELECTRONIC DEVICE

(75) Inventor: Huan-Chin Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 243 days.

(21) Appl. No.: 13/045,524

(22) Filed: Mar. 10, 2011

(65) Prior Publication Data

US 2012/0170218 A1 Jul. 5, 2012

(30) Foreign Application Priority Data

Dec. 31, 2010 (TW) ................................ 99147081 A

(51) Int. Cl.
*H05K 7/20* (2006.01)
(52) U.S. Cl. ........................................................ 361/695
(58) Field of Classification Search ..................... None
See application file for complete search history.

(56) References Cited

U.S. PATENT DOCUMENTS

| | | | | |
|---|---|---|---|---|
| 4,625,936 A * | 12/1986 | Hadden, Sr. | ................... | 248/544 |
| 5,460,441 A * | 10/1995 | Hastings et al. | .............. | 312/298 |
| 5,477,029 A * | 12/1995 | Skutt et al. | .................... | 219/390 |
| 5,831,240 A * | 11/1998 | Katooka et al. | ............ | 219/130.1 |
| 6,259,798 B1 * | 7/2001 | Perkins et al. | ................. | 381/397 |
| 6,327,139 B1 * | 12/2001 | Champion et al. | ............. | 361/608 |
| 6,435,889 B1 * | 8/2002 | Vinson et al. | ................. | 439/247 |
| 6,822,861 B2 * | 11/2004 | Meir | .............................. | 361/695 |
| 6,896,344 B2 * | 5/2005 | Tsutsumi et al. | ........... | 312/330.1 |
| 6,970,353 B2 * | 11/2005 | Brovald et al. | ................. | 361/679.5 |
| 7,221,567 B2 * | 5/2007 | Otsuki et al. | ................. | 361/695 |
| 2002/0141154 A1 * | 10/2002 | Huang et al. | ................... | 361/688 |
| 2008/0144278 A1 * | 6/2008 | Yang et al. | ..................... | 361/688 |

\* cited by examiner

*Primary Examiner* — Lisa Lea Edmonds
*Assistant Examiner* — Xanthia C Cunningham
(74) *Attorney, Agent, or Firm* — Altis Law Group, Inc.

(57) ABSTRACT

An electronic device includes an enclosure, a circuit board mounted in the enclosure, a fan received in the enclosure, a connection line electrically connected between the circuit board and the fan, and a collapsible cable management member. The connection line includes a first cable, and a first and a second connectors respectively connected to opposite ends of the first cable. The cable management member includes a number of fastening poles rotatably connected head-to-tail together. One extremity of the fastening pole of the cable management member is rotatably mounted to the first connector. The first cable is mounted lengthwise on the fastening poles to be collapsible with the cable management member. The second connector is electrically connected to the fan.

5 Claims, 4 Drawing Sheets

ELECTRONIC DEVICE

BACKGROUND

1. Technical Field

The present disclosure relates to an electronic device.

2. Description of Related Art

With the continuing development of electronic technology, electronic devices, such as servers and computers, are using faster and smaller components and thus cooling of these components are critical for performance and reliability. A common method for dissipating the heat is to use fans to generate airflow to dissipate heat from the electronic device. The fans are electrically connected to and are received in the electronic device by power cables. However, the power cables are often disorderly received in the electronic devices, which makes it inconvenient to receive the fans in the electronic devices.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
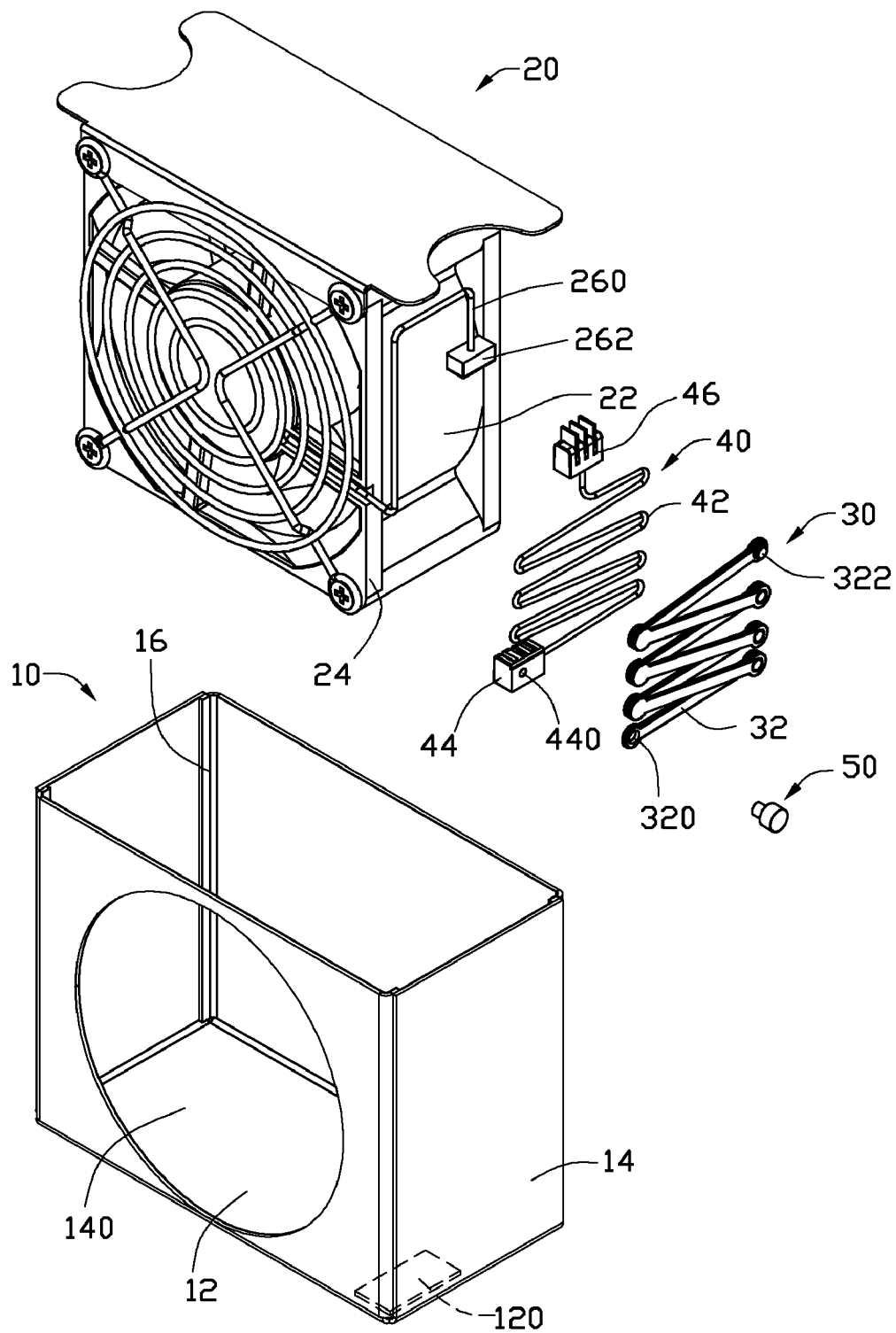
FIG. 1 is an exploded, isometric view of an exemplary embodiment of an electronic device.

Referring to FIG. 1, an exemplary embodiment of an electronic device includes an enclosure 10, a fan 20, a cable management member 30, a connection line 40, and a fastener 50.

The enclosure 10 is substantially box-shaped, and includes a substantially rectangular bottom plate 12, four side plates 14 substantially perpendicularly extending from sides of the bottom plate 12, with a receiving space 16 bound by the bottom plate 12 and the side plates 14. A circuit board 120 is mounted to the bottom plate 12. One of the side plates 14 defines an opening 140.

The fan 20 includes a frame 24, a main body 22 mounted in the frame 24, a cable 260 electrically connected to the main body 22 and located beside the frame 24, and a connector 262 electrically connected to a distal end of the cable 260 opposite to the main body 22.

The cable management member 30 includes a plurality of bar-shaped fastening poles 32. A first end of each fastening pole 32 defines a pivot hole 320, and a pivot post 322 extends from a second end of each fastening pole 32 opposite to the first end. The fastening poles 32 are head-to-tail rotatably connected together by the pivot posts 322 rotatably engaging in the corresponding pivot holes 320. Thereby, the cable management member 30 is collapsible.

The connection line 40 includes a cable 42, and a first and a second connectors 44 and 46 electrically connected to opposite ends of the cable 42. The first connector 44 defines a fastening hole 440.

In this embodiment, the fastening member 50 is a bolt.

Figure 2:
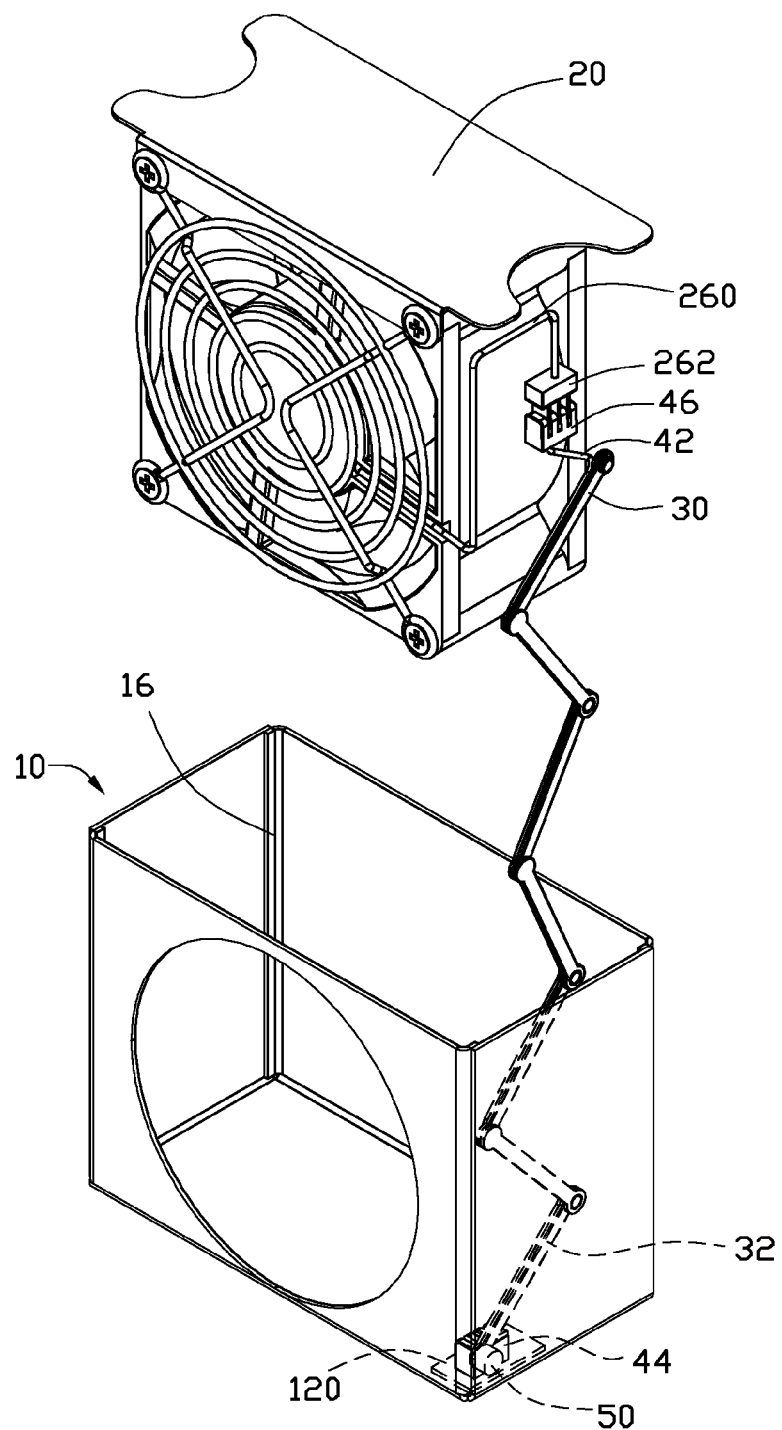
FIGS. 2 to 4 are assembled, isometric views of the electronic device of FIG. 1, showing different use states of the electronic device.
Figure 3:
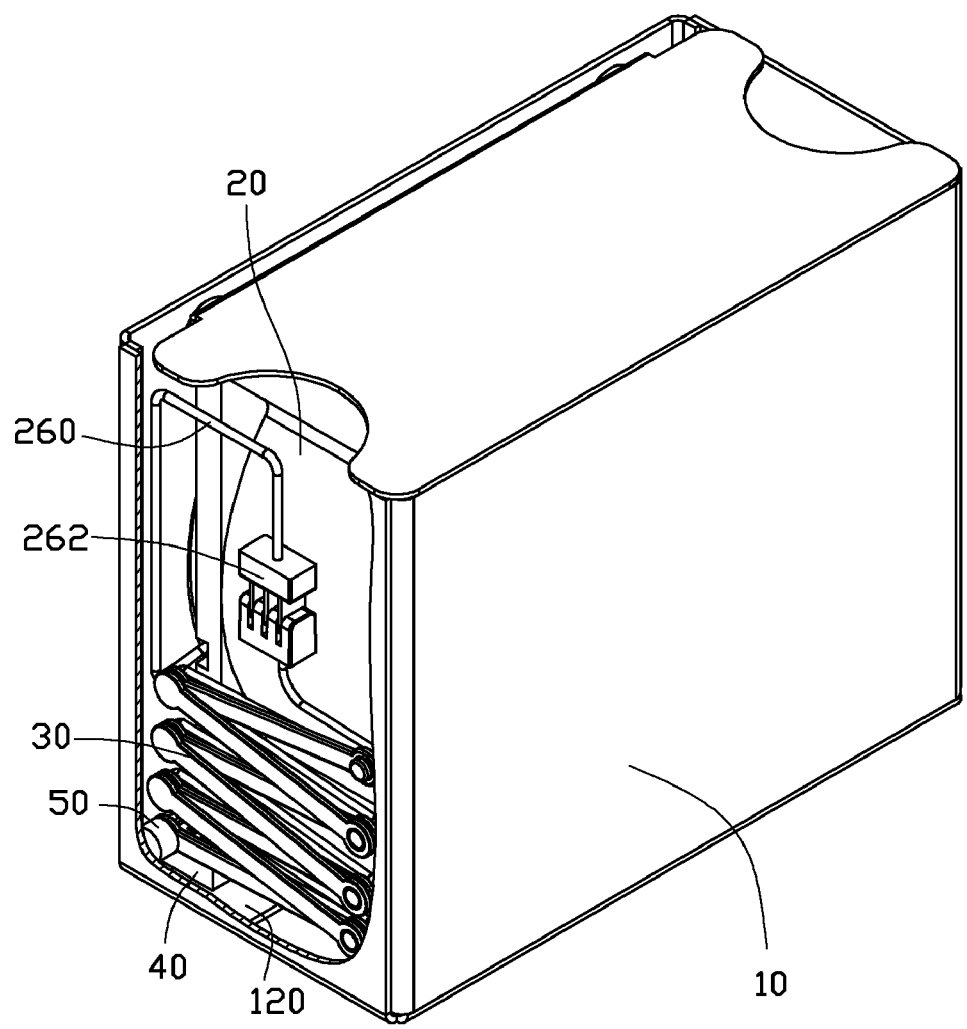
Figure 4:
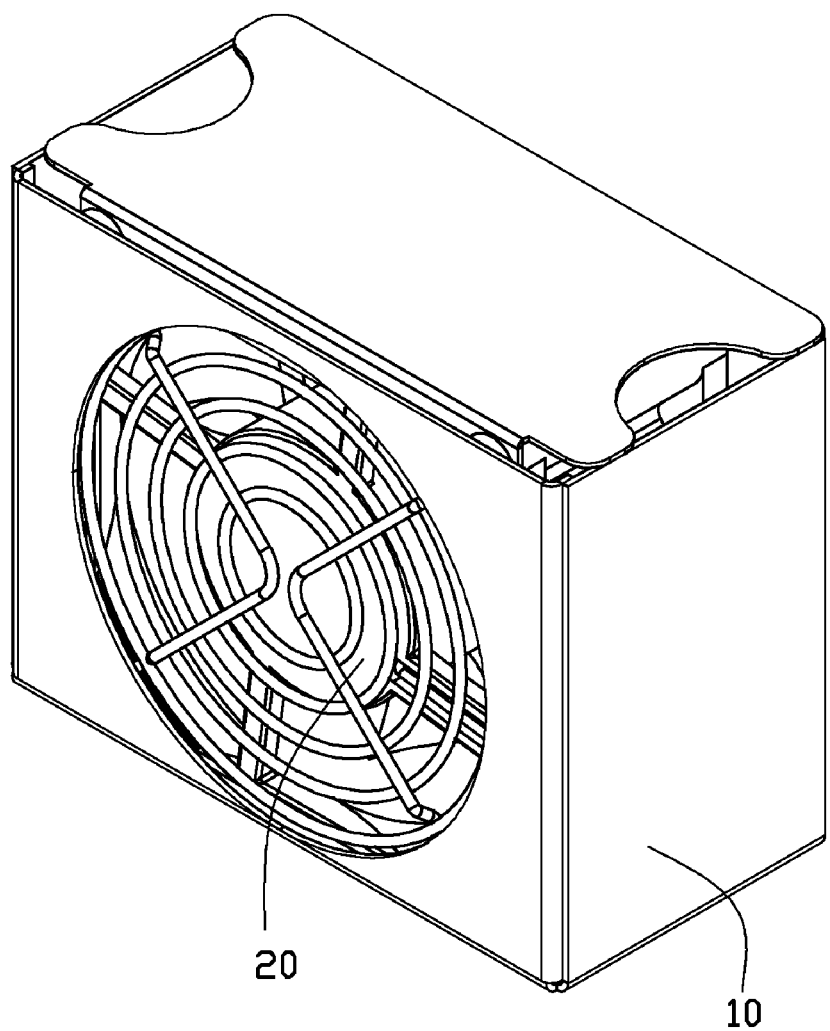

Referring to FIGS. 2 to 4, in assembly, the cable 42 is mounted on the fastening poles 32 along the length. In this embodiment, the cable 42 is stuck on the fastening poles 32 by glue. The pivot hole 320 of one extremity of the fastening pole 32 of the cable management member 30 aligns with the fastening hole 440 of the first connector 44, and the fastening member 50 extends through the pivot hole 320 and engages in the fastening hole 440 to rotatably fasten the cable management member 30 to the first connector 44. The first connector 44 is mounted on and is electrically connected to the circuit board 120. The cable management member 30 is operated to extend, with the cable 42 elongated by the fastening poles 32 rotating relative to each other, thereby the second connector 46 can be extended to be electrically connected to the connector 262. The fan 20 is then received in the receiving space 16, with the main body 22 aligning with the opening 140. The cable management member 30 is collapsible with the fastening poles 32 rotating relative to each other. Thus, the cable 42 is collapsible and received in the receiving space 16. This electronic device can allow the cable to be collapsible, which is convenient for receiving the fan 20.

In other embodiments, the cable 42 can be tied to the fastening poles 32 by a plurality of ties (not shown).

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. An electronic device comprising:
an enclosure;
a circuit board mounted in the enclosure;
a fan received in the enclosure;
a connection line comprising a first cable, and a first and a second connectors respectively electrically connected to opposite ends of the first cable, wherein the first and second connectors are respectively electrically connected to the circuit board and the fan; and
a collapsible cable management member comprising a plurality of fastening poles head-to-tail rotatably connected together, one extremity fastening pole is rotatably mounted to the first connector;
wherein the first cable is mounted lengthwise on the fastening poles, so that the first cable is collapsible with the cable management member when received in the enclosure.

2. The electronic device of claim 1, wherein a first end of each fastening pole defines a pivot hole, and a pivot post extends from a second end of each fastening pole opposite to the first end, so that the fastening poles are rotatably connected head-to-tail together by the pivot posts rotatably engaging in the corresponding pivot holes.

3. The electronic device of claim 2, further comprising a fastening member, wherein the first connector defines a fastening hole, the fastening member extends through the pivot hole of the extremity fastening pole to engage in the fastening hole, to rotatably fasten the cable management member to the first connector.

4. The electronic device of claim 1, wherein the first cable adheres to the fastening poles by glue.

5. The electronic device of claim 1, wherein the fan comprises a main body, a second cable electrically connected to the main body, and a third connector electrically connected to a distal end of the second cable opposite to the main body, the second connector is electrically connected to the third connector.

* * * * *